United States Patent
Tamaki et al.

(10) Patent No.: US 10,157,952 B2
(45) Date of Patent: Dec. 18, 2018

(54) IMAGING DEVICE INCLUDING SEMICONDUCTOR SUBSTRATE AND UNIT PIXEL CELL

(71) Applicant: Panasonic Intellectual Property Management Co., Ltd., Osaka (JP)

(72) Inventors: Tokuhiko Tamaki, Osaka (JP); Junji Hirase, Osaka (JP); Shigeo Yoshii, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/714,293

(22) Filed: May 17, 2015

(65) Prior Publication Data
US 2015/0340393 A1  Nov. 26, 2015

(30) Foreign Application Priority Data

May 23, 2014 (JP) .................. 2014-107506
Dec. 15, 2014 (JP) .................. 2014-253391

(51) Int. Cl.
*H01L 27/146* (2006.01)

(52) U.S. Cl.
CPC .. *H01L 27/14636* (2013.01); *H01L 27/14609* (2013.01); *H01L 27/14623* (2013.01); *H01L 27/14632* (2013.01); *H01L 27/14643* (2013.01)

(58) Field of Classification Search
CPC .................. H01L 27/1225; H01L 27/1463
See application file for complete search history.

(56) References Cited

U.S. PATENT DOCUMENTS

| | | | |
|---|---|---|---|
| 5,539,461 A | 7/1996 | Andoh et al. | |
| 2008/0303071 A1* | 12/2008 | Hong | H01L 27/1463 257/292 |
| 2010/0320514 A1* | 12/2010 | Tredwell | H01L 27/14609 257/291 |

(Continued)

FOREIGN PATENT DOCUMENTS

| | | |
|---|---|---|
| JP | 6-244397 | 9/1994 |
| JP | 6-334920 | 12/1994 |

(Continued)

*Primary Examiner* — Thao X Le
*Assistant Examiner* — Geoffrey Ida
(74) *Attorney, Agent, or Firm* — McDermott Will & Emery LLP

(57) ABSTRACT

An imaging device includes a semiconductor substrate and at least one unit pixel cell provided to a surface of the semiconductor substrate. Each of the at least one unit pixel cell includes: a photoelectric converter including a pixel electrode and a photoelectric conversion layer located on the pixel electrode, the photoelectric converter converting incident light into electric charges; a charge detection transistor that includes a part of the semiconductor substrate and detects the electric charges; and a reset transistor that includes a gate electrode and initializes a voltage of the photoelectric converter. The pixel electrode is located above the charge detection transistor. The reset transistor is located between the charge detection transistor and the pixel electrode. When viewed from a direction normal to the surface of the semiconductor substrate, at least a part of the gate electrode is located outside the pixel electrode.

9 Claims, 10 Drawing Sheets

(56) References Cited

U.S. PATENT DOCUMENTS

| | | | |
|---|---|---|---|
| 2011/0108836 A1* | 5/2011 | Koyama | H01L 27/1225 257/43 |
| 2011/0115003 A1 | 5/2011 | Okita et al. | |
| 2011/0215323 A1 | 9/2011 | Kurokawa et al. | |
| 2013/0285046 A1* | 10/2013 | Yamazaki | H01L 27/14609 257/43 |
| 2013/0313410 A1 | 11/2013 | Goto | |
| 2014/0042582 A1* | 2/2014 | Kondo | H01L 31/02 257/443 |

FOREIGN PATENT DOCUMENTS

| | | |
|---|---|---|
| JP | 2011-119711 A | 6/2011 |
| JP | 2011-119950 | 6/2011 |
| JP | 2011-129873 | 6/2011 |
| JP | 2011-211699 | 10/2011 |
| JP | 2011-238781 A | 11/2011 |
| JP | 2012-019169 | 1/2012 |
| JP | 2012-151771 | 8/2012 |
| JP | 2013-243355 | 12/2013 |
| WO | 2011/067878 | 6/2011 |

* cited by examiner

IMAGING DEVICE INCLUDING SEMICONDUCTOR SUBSTRATE AND UNIT PIXEL CELL

BACKGROUND

1. Technical Field

The present disclosure relates to an imaging device.

2. Description of the Related Art

A solid-state imaging device (image sensor) includes a plurality of light receivers (pixels) that are two-dimensionally arrayed. An incident light into the light receiver is photoelectrically converted into electric charges. The electric charges are accumulated in a charge storage capacitance (floating diffusion (FD)), and a signal corresponding to the accumulated electric charges is read out.

In a solid-state imaging device as described above, a technique that uses a transistor composed of an oxide semiconductor to reduce leakage currents is known (for example, see Japanese Unexamined Patent Application Publication No. 2011-119950 and Japanese Unexamined Patent Application Publication No. 2011-211699).

Furthermore, a technique that uses an organic photoelectric conversion layer as a photoelectric conversion element is known (for example, see Japanese Unexamined Patent Application Publication No. 2012-151771).

SUMMARY

In an imaging device using an organic photoelectric conversion layer as a photoelectric conversion element, it is demanded to acquire a wide dynamic range characteristic as well as to reduce leakage currents.

One non-limiting and exemplary embodiment provides an imaging device that can achieve both reduction of leakage currents and a wide dynamic range.

In one general aspect, the techniques disclosed here feature an imaging device including a semiconductor substrate and at least one unit pixel cell provided to a surface of the semiconductor substrate, each of the at least one unit pixel cell including: a photoelectric converter that includes a pixel electrode and a photoelectric conversion layer located on the pixel electrode, the photoelectric converter converting incident light into electric charges; a charge detection transistor that includes a part of the semiconductor substrate and detects the electric charges; and a reset transistor that includes a gate electrode and initializes a voltage of the photoelectric converter. The pixel electrode is located above the charge detection transistor. The reset transistor is located between the charge detection transistor and the pixel electrode. When viewed from a direction normal to the surface of the semiconductor substrate, at least a part of the gate electrode is located outside the pixel electrode.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION (Underlying Knowledge Forming Basis of the Present Disclosure)

Before an imaging device in embodiments according to the present disclosure is described, underlying knowledge forming the basis of the present disclosure will be described. It should be noted that a solid-state imaging device using an organic photoelectric conversion layer as a photoelectric conversion element will be described below as an example of an imaging device.

A solid-state imaging device using an InGaZnO layer as a material constructing a reset transistor for resetting the potential of a signal charge can be considered. With this structure, when attempting to form a thin film transistor using an InGaZnO layer on the same plane as a transistor formed on a semiconductor substrate (silicon substrate), the area must be large in the horizontal direction. To seek to reduce the area, the reset transistor may be disposed above the semiconductor substrate, not on the same plane as the transistor formed on the semiconductor substrate. However, in a solid-state imaging device in which a photoelectric converter is disposed on the light receiving face side, the distance between a gate electrode of the reset transistor and a pixel electrode of the photoelectric converter is short, whereby a parasitic capacitance due to coupling of the gate electrode of the reset transistor and the pixel electrode is increased. With this, as illustrated in FIG. 10, potential fluctuations of a charge storage capacitance 112 are increased when the reset transistor is switched from the on state to the off state.

Figure 10:
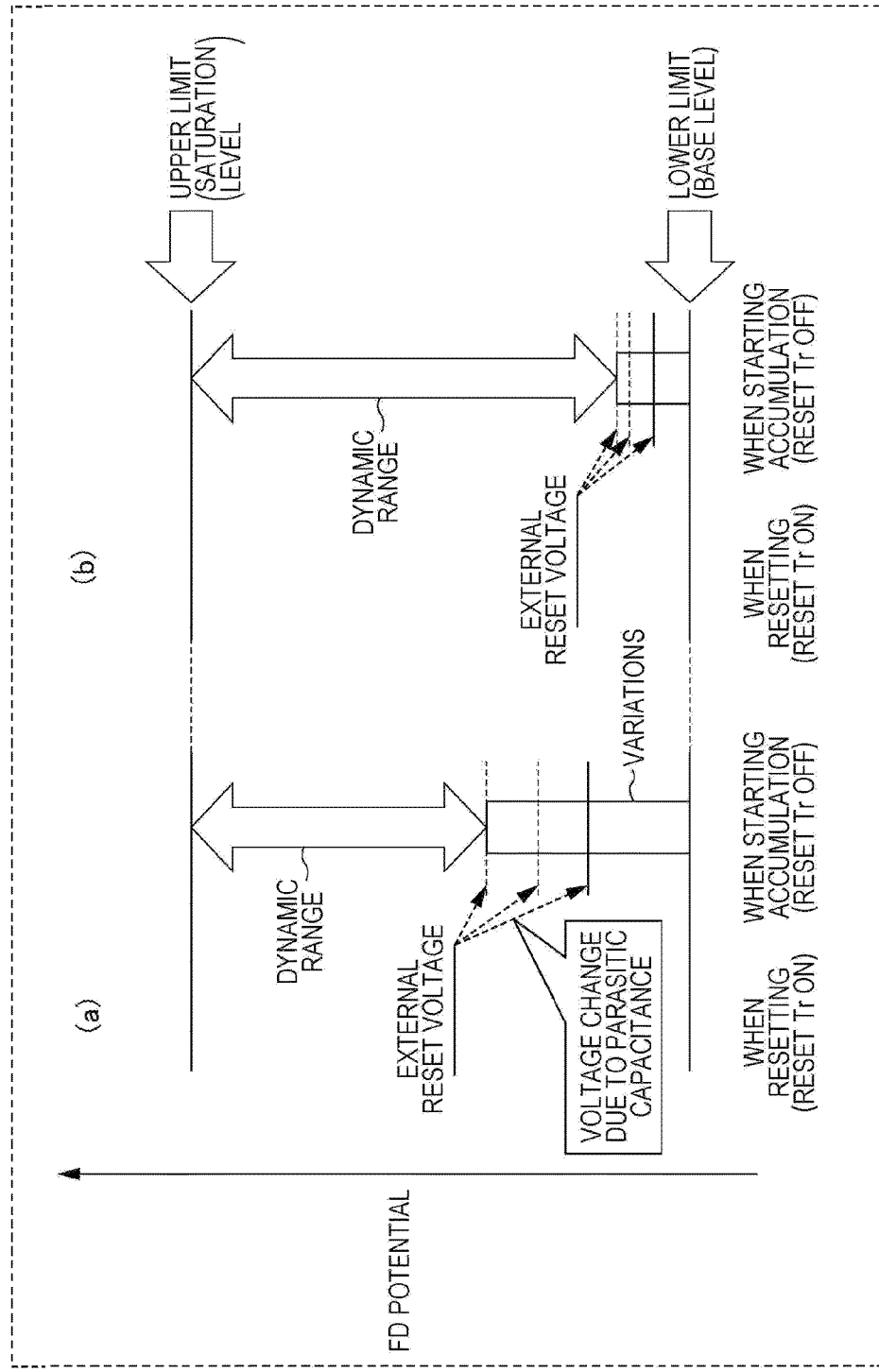
FIG. 10 is diagram illustrating influence of a parasitic capacitance between a gate electrode of a reset transistor and a pixel electrode on an FD potential.

FIG. 10 is diagram illustrating influence of a parasitic capacitance between the gate electrode of the reset transistor and the pixel electrode on the potential of the charge storage capacitance (FD potential). FIG. 10(a) illustrates a case where the parasitic capacitance is large. FIG. 10(b) illustrates a case where the parasitic capacitance is small.

The reset transistor is a transistor for discharging (resetting) charges accumulated in the charge storage capacitance to a predetermined charge amount once. The reset transistor discharges the charges accumulated in the charge storage capacitance in the on state, and stops discharging the charges in the off state. The reset transistor is switched between the on state and the off state by a voltage applied to a gate of the reset transistor.

An FD potential when the reset transistor is switched from the on state to the off state will now be described. When a gate potential of the reset transistor is changed so that the reset transistor is switched from the on state to the off state, the FD potential also fluctuates due to capacitive coupling.

At this time, if the parasitic capacitance between the gate electrode of the reset transistor and the pixel electrode is large, as illustrated in FIG. 10A, the amount of fluctuations of the FD potential becomes large, and variations in the amount of fluctuations also become large in proportion to the amount of fluctuations of the FD potential. Accordingly, if the parasitic capacitance is large, a reset voltage Vreset needs to be set high in anticipation of the variations, and as a result, the dynamic range of the FD potential becomes small. For this reason, a technique that reduces the parasitic capacitance between the gate electrode of the reset transistor and the pixel electrode is demanded.

A solid-state imaging device according to one aspect of the present disclosure includes a semiconductor substrate and at least one unit pixel cell provided to a surface of the semiconductor substrate, each of the at least one unit pixel cell including: a photoelectric converter that includes a pixel electrode and a photoelectric conversion layer located on the pixel electrode, the photoelectric converter converting incident light into electric charges; a charge detection transistor that includes a part of the semiconductor substrate and detects the electric charges; and a reset transistor that includes a gate electrode and initializes a voltage of the photoelectric converter. The pixel electrode is located above the charge detection transistor. The reset transistor is located between the charge detection transistor and the pixel electrode. When viewed from a direction normal to the surface of the semiconductor substrate, at least a part of the gate electrode is located outside the pixel electrode.

With this structure, leakage currents of the charge storage capacitance can be reduced by utilizing the low leakage characteristic of a transistor using an oxide semiconductor layer. Furthermore, because at least a part of the gate electrode of the reset transistor is disposed outside the pixel electrode electrically connected to the reset transistor in a plan view, the parasitic capacitance between the gate electrode of the reset transistor and the pixel electrode can be reduced. With this, variations in the fluctuations of the FD potential generated when the reset transistor is switched from the on state to the off state becomes small, and the dynamic range of the charge storage capacitance can be designed to be wide, as illustrated in FIG. 10B. It is thus possible to seek for both reduction of leakage currents and a wide dynamic range.

Furthermore, because the thickness of an insulating layer between the pixel electrode and the gate electrode does not need to be made large to reduce leakage currents, the insulating layer between the pixel electrode and the gate electrode can be made thin. It is thus possible to seek to miniaturize the solid-state imaging device.

Furthermore, the part of the semiconductor substrate may comprise a first semiconductor. The reset transistor may include at least a part of a semiconductor layer, the at least a part of the semiconductor layer comprising a second semiconductor. A band gap of the second semiconductor may larger than a band gap of the first semiconductor.

With this structure, the reset transistor includes a semiconductor having a larger band gap than the semiconductor constructing the semiconductor substrate, whereby leakage currents due to minority carriers from the charge storage capacitance can be suppressed. It should be noted that the term "band gap" is defined with respect to a crystal, to be strict. However, an energy gap optically observed as an effective band gap is herein referred to as a band gap, also with respect to an amorphous semiconductor.

Furthermore, the reset transistor may include a source electrode and a drain electrode. The charge detection transistor may be connected to the pixel electrode and one of the source electrode and the drain electrode.

Furthermore, the at least one unit pixel cell includes unit pixel cells, and when viewed from the direction normal to the surface of the semiconductor substrate, at least a part of the gate electrode included in one of the unit pixel cells is located in a position closer to the pixel electrode included in a unit pixel cell adjacent to the one of the unit pixel cells than the pixel electrode included in the one of the unit pixel cells.

With this structure, the parasitic capacitance formed by the pixel electrode and a charge transport region of the reset transistor can be reduced. Increase in off-leakage currents of the reset transistor thus can be suppressed.

Furthermore, the at least one unit pixel cell includes unit pixel cells, and when viewed from the direction normal to the surface of the semiconductor substrate, at least a part of the gate electrode included in one of the unit pixel cells overlaps the pixel electrode included in a unit pixel cell adjacent to the one of the unit pixel cells.

With this structure, the distance between the drain electrode and the source electrode of the reset transistor, that is, the gate length of the reset transistor may be made long, whereby off-leakage currents of the reset transistor can be suppressed. In the solid-state imaging device, imaging thus can be performed in a high dynamic range.

Furthermore, each of the at least one unit pixel cell may further include a light shielding film having a light shielding property. When viewed from the direction normal to the surface of the semiconductor substrate, the light shielding film may be located in a position continuous with the pixel electrode. At least a part of the gate electrode may overlapp the light shielding film.

With this structure, an incident light on the reset transistor can be suppressed.

Furthermore, the reset transistor may include at least a part of a semiconductor layer. The photoelectric converter may be located above the surface of the semiconductor substrate through a multilayer interconnection structure, and the multilayer interconnection structure may include a lower interconnection layer and an upper interconnection layer, the lower interconnection layer being closer to the semiconductor substrate than the upper interconnection layer is. The semiconductor layer may be located in a same layer as the upper interconnection layer.

With this structure, process damage on an oxide semiconductor and a photoelectric conversion film can be minimized without any adverse effects on the circuit area or the driving speed, and the characteristic shift of the oxide semiconductor can be suppressed. Improvement in the total circuit performance is thus enabled.

Furthermore, the upper interconnection layer may be an uppermost layer of the multilayer interconnection structure.

With this structure, process damage can be further suppressed.

It should be noted that the present disclosure can be implemented as a semiconductor integrated circuit (SIC) including part or all of the functions of an imaging device as described above or implemented as a camera including an imaging device as described above.

Embodiments according to the present disclosure will be described below in detail with reference to the drawings.

It should be noted that each of the embodiments described below represents a specific example according to the present disclosure. Numerical values, shapes, materials, components, arrangement positions and connection forms of components, steps, the order of steps, and the like described in the embodiments below are merely examples and not intended to limit the present disclosure. Furthermore, out of the components described in the embodiments below, any component that is not described in the independent claims showing a top level concept of the present disclosure will be explained as an optional component.

Embodiment 1

In a solid-state imaging device according to the present embodiment, a charge storage capacitance is electrically insulated from a semiconductor substrate. With this, leakage currents of the charge storage capacitance are reduced.

Figure 1:
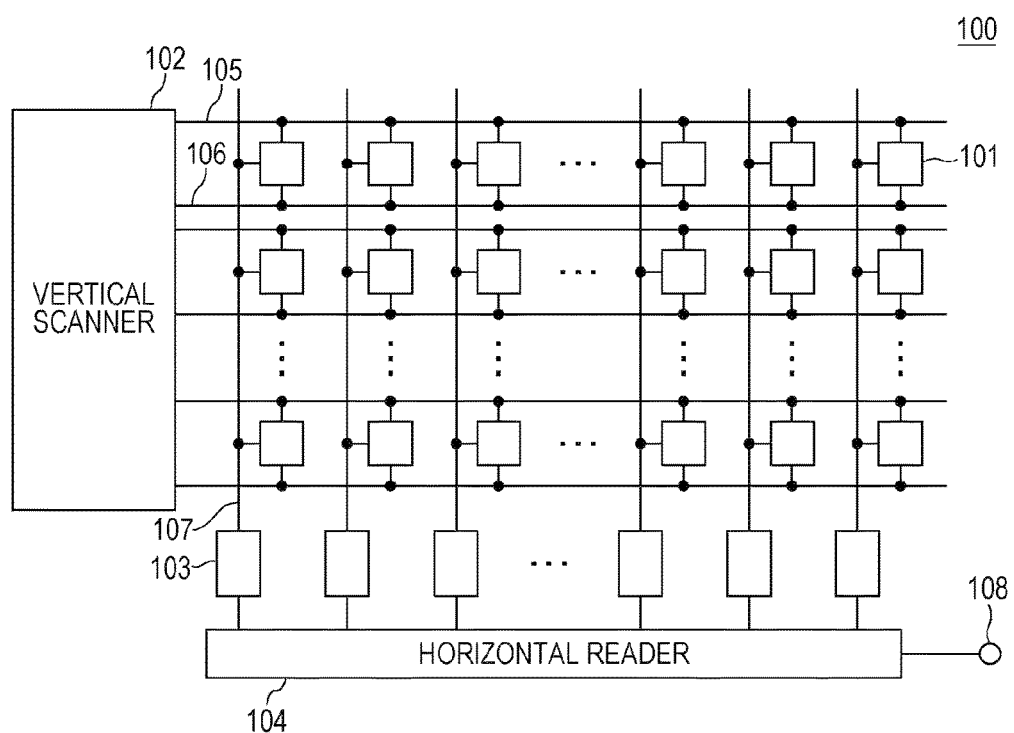
FIG. 1 is a block diagram of an imaging device according to Embodiment 1.

Firstly, the overall structure of the solid-state imaging device according to the present embodiment will be described. FIG. 1 is a block diagram illustrating the structure of the solid-state imaging device according to the present embodiment.

A solid-state imaging device 100 illustrated in FIG. 1 includes a plurality of pixels (unit pixel cells) 101 disposed in matrix, a vertical scanner 102, a plurality of column signal processors 103 provided for each column, a horizontal reader 104, a plurality of reset control lines 105 provided for each row, a plurality of address control lines 106 provided for each row, a plurality of vertical signal lines 107 provided for each column, and a horizontal output terminal 108. It should be noted that at least one of the pixels 101 correspond to the at least one unit pixel cell according to the present disclosure. The pixels 101 may include one or more pixels which do not correspond to the at least one unit pixel cell in the present disclosure. Also each of the pixels 101 may correspond to the at least one unit pixel cell in the present disclosure.

Each of the pixels 101 outputs a signal in accordance with an incident light to the vertical signal line 107 provided on the corresponding column.

The vertical scanner 102 resets the pixels 101 via the reset control lines 105. Furthermore, the vertical scanner 102 sequentially selects the pixels 101 row by row via the address control lines 106.

Each of the column signal processors 103 performs signal processing on the signal output to the vertical signal line 107 provided on the corresponding column. And each of the column signal processors 103 outputs the signal acquired by the signal processing to the horizontal reader 104. The column signal processors 103 performs processing such as noise suppression signal processing represented by correlated double sampling and analog/digital conversion processing, for example.

The horizontal readers 104 sequentially outputs a plurality of signals processed by the column signal processors 103 to the horizontal output terminal 108.

Figure 2:
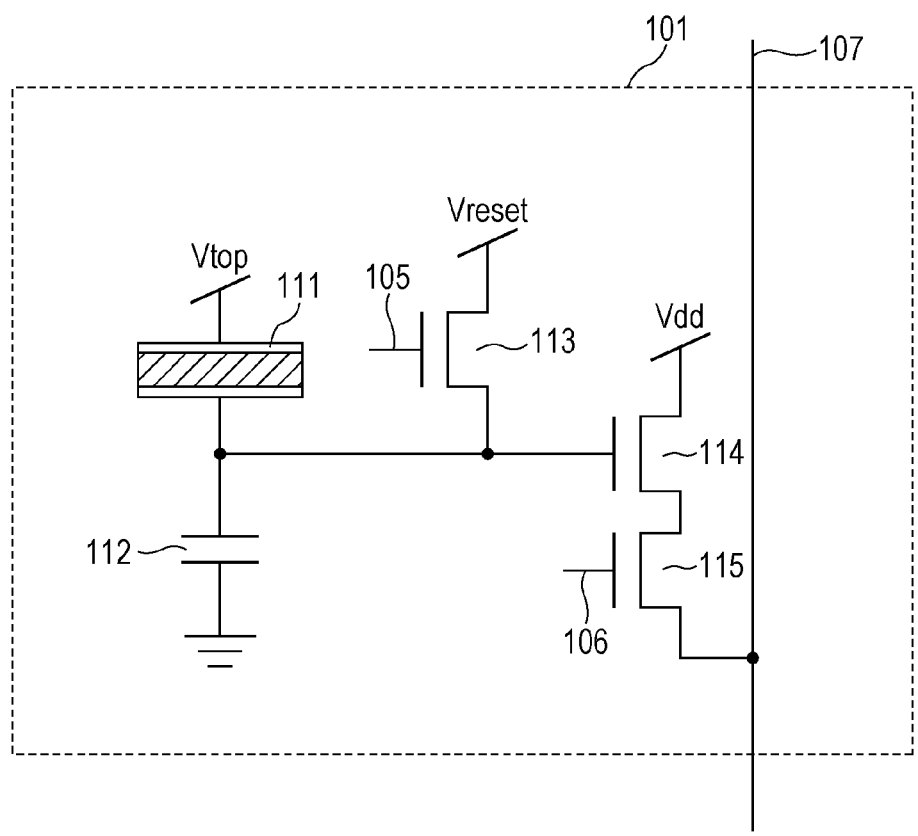
FIG. 2 is a circuit diagram of a pixel according to Embodiment 1.

The structure of the pixels 101 will be described below. FIG. 2 is a circuit diagram illustrating the structure of the pixel 101.

As illustrated in FIG. 2, the pixel 101 includes a photoelectric converter 111, a charge storage capacitance 112, a reset transistor 113, an amplification transistor 114 (source follower transistor), and a selection transistor 115. It should be noted that the amplification transistor 114 is an example of the charge detecting transistor according to the present disclosure. The reset transistor 113 is an example of the reset transistor according to the present disclosure.

The photoelectric converter 111 generates a signal charge by photoelectrically converting an incident light. To one end of the photoelectric converter 111, a voltage Vtop is applied.

The reset transistor 113 is used for resetting the potential of the signal charge. The gate of the reset transistor 113 is connected to the reset control line 105, and the source of the reset transistor 113 is connected to the gate of the amplification transistor 114 and the lower electrode of the photoelectric converter 111. To the drain of the reset transistor 113, a reset voltage Vreset is applied. It should be noted that a node connecting the source of the reset transistor 113, the gate of the amplification transistor 114, and the lower electrode of the photoelectric converter 111 functions as the charge storage capacitance 112 accumulating the signal charge generated by the photoelectric converter 111, as described in detail later.

It should be noted that the definition of the drain and the source generally depends on the circuit operations and cannot be specified from the element structure in many cases. In the present embodiment, one of the source and the drain is referred to as a source, and the other of the source and the drain is referred to as a drain, for the sake of convenience. However, the drain in the present embodiment may be replaced with the source, and the source may be replaced with the drain.

Furthermore, in the present embodiment, the reset transistor 113 is composed of an oxide semiconductor (for example, InGaZnO).

The amplification transistor 114 amplifies the voltage of the charge storage capacitance 112 described above and thereby outputs a signal in accordance with the voltage to the vertical signal line 107. To the drain of the amplification transistor 114, a power supply voltage Vdd or a ground voltage Vss is applied.

The selection transistor 115 is connected in series to the amplification transistor 114 and switches whether or not to output a signal amplified by the amplification transistor 114 to the vertical signal line 107. The gate of the selection transistor 115 is connected to the address control line 106, the drain of the selection transistor 115 is connected to the source of the amplification transistor 114, and the source of the selection transistor 115 is connected to the vertical signal line 107.

Furthermore, the voltage Vtop, the reset voltage Vreset, and the power supply voltage Vdd, for example, are voltages commonly used in all the pixels 101.

Figure 3A:
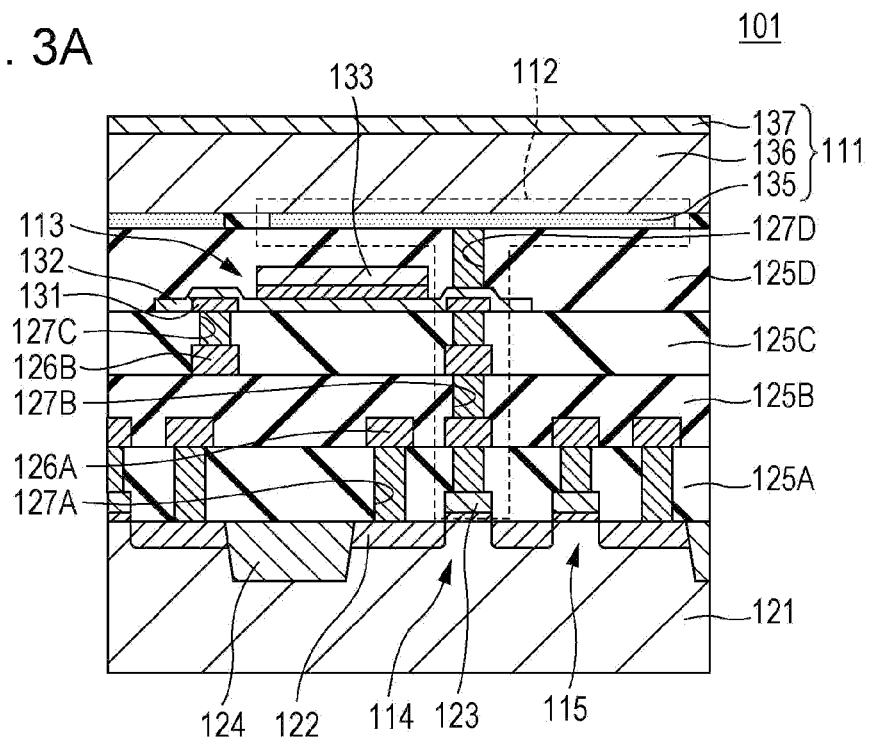
FIG. 3A is a cross-section view illustrating the structure of the pixel according to Embodiment 1.
Figure 3B:
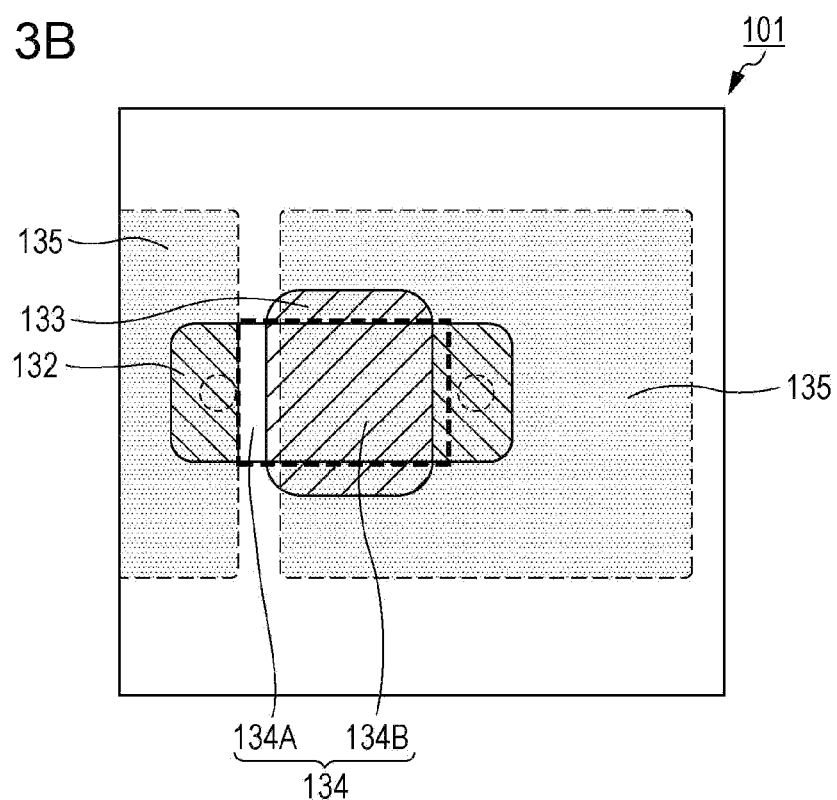
FIG. 3B is a plan view illustrating the structure of the pixel according to Embodiment 1.

Next, the cross-sectional structure of the pixel 101 will be described. FIG. 3A is a cross-section view of the pixel 101 and FIG. 3B is a plan view of the pixel 101. It should be noted that in the plan view in FIG. 3B, for ease of understanding, an oxide semiconductor layer 132, a gate electrode 133, and a pixel electrode 135 are hatched in the same way as in FIG. 3A.

As illustrated in FIG. 3A, the solid-state imaging device 100 includes a semiconductor substrate 121, a diffusion layer 122, a gate electrode 123, an element isolation region 124, insulating layers 125A to 125D, interconnection layers 126A and 126B, and contacts 127A to 127D (contact holes).

The semiconductor substrate 121 is a silicon substrate, for example. On the semiconductor substrate 121, the amplification transistor 114 and the selection transistor 115 are formed.

Each of the amplification transistor 114 and the selection transistor 115 includes two diffusion layers 122 being a source and a drain and the gate electrode 123.

The diffusion layer 122 is formed in the semiconductor substrate 121. The gate electrode 123 is formed on the semiconductor substrate 121 via a gate insulating film.

The element isolation region 124 is formed in the semiconductor substrate 121 and isolates the transistors of the pixel 101 from the transistors of the pixel 101 adjacent thereto.

The insulating layer 125A is formed on the semiconductor substrate 121 so as to cover the amplification transistor 114 and the selection transistor 115.

The interconnection layer 126A is formed on the insulating layer 125A. The contact 127A is formed in the insulating layer 125A and electrically connects the diffusion layer 122 and the gate electrode 123 with the interconnection layer 126A. The insulating layer 125B is formed on the insulating layer 125A so as to cover the interconnection layer 126A.

The interconnection layer 126B is formed on the insulating layer 125B. The contact 127B is formed in the insulating layer 125B and electrically connects the interconnection layer 126A and the interconnection layer 126B. The insulating layer 125C is formed on the insulating layer 125B so as to cover the interconnection layer 126B.

On the insulating layer 125C, the reset transistor 113 is formed. In the present embodiment, the reset transistor 113 is composed of an oxide semiconductor and disposed above the semiconductor substrate 121. This reset transistor 113 includes a source electrode/a drain electrode 131, the oxide semiconductor layer 132, and the gate electrode 133.

The two electrodes 131 are formed on the insulating layer 125C. The contact 127C is formed in the insulating layer 125C and electrically connects the interconnection layer 126B and the electrode 131.

The oxide semiconductor layer 132 is formed on the insulating layer 125C and the two electrodes 131. The oxide semiconductor layer 132 is composed of InGaZnO, for example. Furthermore, one of the two electrodes 131 is connected to the gate electrode 123 of the amplification transistor 114 and the pixel electrode 135, which is described later.

The gate electrode 133 is formed on the oxide semiconductor layer 132 via a gate insulating film. Furthermore, the gate electrode 133 is disposed between the two electrodes 131 in a plan view. It should be noted that in the oxide semiconductor layer 132, the region between the two electrodes 131 being the source and the drain of the reset transistor 113 in a plan view is referred to as a charge transport region 134.

The insulating layer 125D is formed on the insulating layer 125C so as to cover the reset transistor 113.

On the insulating layer 125D, the photoelectric converter 111 is formed. In the present embodiment, the photoelectric converter 111 is not formed in the semiconductor substrate 121 but formed above the semiconductor substrate 121. This photoelectric converter 111 includes the pixel electrode 135 being the lower electrode, the photoelectric conversion layer 136, and a transparent electrode 137 being the upper electrode.

The pixel electrode 135 is formed on the insulating layer 125D. More specifically, the pixel electrode 135 is provided in an upper layer of the amplification transistor 114. This pixel electrode 135 is composed of a metal material having a light shielding property, for example. The pixel electrode 135 is composed of Ti, TiN, Ta, or Mo, for example.

The photoelectric conversion layer 136 is formed on the pixel electrode 135 and converts an incident light into electric charges. This photoelectric conversion layer 136 includes an organic material, for example. It should be noted that the photoelectric conversion layer 136 may include a layer composed of an organic material and a layer composed of an inorganic material. Furthermore, the photoelectric conversion layer 136 may include only a layer formed of an inorganic material. The photoelectric conversion layer 136 may be composed of an amorphous silicon, for example.

The transparent electrode 137 is formed on the photoelectric conversion layer 136 and has light transmitting property. The transparent electrode 137 is composed of indium tin oxide (ITO), for example.

The charge storage capacitance 112 is connected to the photoelectric converter 111 and accumulates a signal charge generated by the photoelectric converter 111. In the present embodiment, the charge storage capacitance 112 is constructed by a parasitic capacitance such as a interconnection capacitance, not by a dedicated capacitance element. Specifically, the charge storage capacitance 112 is constructed only by the parasitic capacitance of the pixel electrode 135, the source of the reset transistor 113 (the electrode 131), the gate electrode 123 of the amplification transistor 114, and the interconnection (interconnection layers and contacts) between these components. The charge storage capacitance 112 may further include a dedicated capacitor. Also the charge storage capacitance 112 may be configured by a dedicated capacitor.

At this point, although the pixel electrode 135 is electrically isolated in each pixel 101, the photoelectric conversion layer 136 and the transparent electrode 137 are formed across a plurality of pixels 101. The pixel electrode 135 is disposed so as to cover part of the gate electrode 133 of the reset transistor 113. More specifically, in a plan view, the gate electrode 133 is disposed so as to be projected toward a pixel electrode 135 adjacent to the pixel electrode 135 to which the reset transistor 113 is electrically connected.

The charge transport region 134 includes a region 134B overlapping the pixel electrode 135 in a plan view and a region 134A not overlapping the pixel electrode 135, as illustrated in FIG. 3B.

Due to the presence of the region 134A not overlapping the pixel electrode 135, the area of the charge transport region 134 overlapping the pixel electrode 135 is smaller than the total area of the charge transport region 134.

The contact 127D is formed in the insulating layer 125D and electrically connects the reset transistor 113 and the pixel electrode 135.

It should be noted that in the example described above, two interconnection layers are provided. However, one interconnection layer or three or more interconnection layers may be provided. Furthermore, although no interconnection layer is provided between the oxide semiconductor transistor (reset transistor 113) and the photoelectric converter 111 in the description above, one or more interconnection layers may be disposed therebetween.

As described above, the solid-state imaging device 100 according to the present embodiment includes the photoelectric converter 111 formed above the semiconductor substrate 121. Furthermore, as illustrated in the circuit diagram in FIG. 2, the solid-state imaging device 100 has a structure in which no transfer transistor is provided between the photoelectric converter 111 and charge storage capacitance 112. Generally speaking, with this structure, compared with a structure in which a transfer transistor is provided between the photoelectric converter 111 and charge storage capacitance 112, charges are retained in the charge storage capacitance 112 for a longer time. Leakage currents of the charge storage capacitance 112 thus have a great influence on the characteristics. On the other hand, in the present embodiment, an oxide semiconductor transistor composed of an oxide semiconductor is used as the reset transistor 113. With this, leakage currents can be suppressed, compared with a case where a silicon transistor formed on the semiconductor substrate 121 is used as the reset transistor 113. As described above, when the influence of leakage currents of the charge storage capacitance 112 is significant, the solid-state imaging device 100 according to the present embodiment can suppress the leakage currents.

Furthermore, in the solid-state imaging device 100 according to the present embodiment, the charge storage capacitance 112 is not electrically connected to the diffusion layer formed in the semiconductor substrate 121. In other words, the charge storage capacitance 112 is electrically insulated from the semiconductor substrate 121.

At this point, in a structure in which leakage currents can be sufficiently reduced as described above, when the charge storage capacitance 112 is connected to the semiconductor substrate 121 (diffusion layer 122), leakage currents of a pn junction become dominant in the leakage currents of the charge storage capacitance 112. By contrast, in the present embodiment, because the charge storage capacitance 112 is not electrically connected to the semiconductor substrate 121 (diffusion layer 122), the influence of the leakage currents can be further suppressed.

Furthermore, due to the presence of the region 134A not overlapping the pixel electrode 135, the area of the charge transport region 134 overlapping the pixel electrode 135 is smaller than the total area of the charge transport region 134. With this, a parasitic capacitance formed by the pixel electrode 135 of the photoelectric converter 111 and the charge transport region 134 of the reset transistor 113 is reduced.

As described above, in the pixel 101, a parasitic capacitance formed by pixel electrode 135 and the charge transport region 134 of the reset transistor 113 can be reduced, whereby the dynamic range of the solid-state imaging device can be substantially widened.

It should be noted that a semiconductor having a large band gap such as an oxide semiconductor is affected by heat treatment and diffusion of an impurity such as hydrogen, and the characteristics thereof are susceptible to shift. Furthermore, a photoelectric conversion film is also affected by high-temperature heat treatment, and the photoelectric conversion characteristic thereof is deteriorated. On the other hand, the interconnection used in the peripheral circuit which is subject to a current on the order of mA will need regular heat treatment so that the current resistance thereof is secured. For these reasons, the reset transistor 113 composed of an oxide semiconductor is desirably disposed in an upper layer, not in a lower layer of the multilayer interconnection layer used in the peripheral circuit. With this structure, process damage on an oxide semiconductor and a photoelectric conversion film can be minimized without any adverse effects on the circuit area or the driving speed, and the characteristic shift of the oxide semiconductor can be suppressed. Improvement in the total circuit performance is thus enabled.

The reset transistor includes a semiconductor having a larger band gap than that of the semiconductor constructing the semiconductor substrate, whereby leakage currents due to minority carriers from the charge storage capacitance can be suppressed. It should be noted that the term "band gap" is defined with respect to a crystal, to be strict. However, an energy gap optically observed as an effective band gap is herein referred to as a band gap, also with respect to an amorphous semiconductor.

Furthermore, with this structure, a charge detecting transistor, which needs a high driving capability for ensuring gains and needs small characteristic variations, is disposed on a semiconductor substrate. Furthermore, a reset transistor, which can allow relatively large characteristic variations in view of the circuit operations, is disposed in a layer upper than the charge detecting transistor and lower than the pixel electrode. With this, overall circuit operation characteristics can be secured while the reduction in the area is maintained.

Furthermore, in the description above, an example in which the reset transistor 113 is composed of an oxide semiconductor is described. However, the semiconductor layer of the reset transistor 113 may be composed mainly of an oxide semiconductor. More specifically, one publicly known as an oxide semiconductor may be used in general. As long as the transistor characteristics are not adversely affected, a small amount of impurity or minor components mixed during production may be included.

Furthermore, an oxide semiconductor used in the semiconductor layer of the reset transistor 113 is not limited to InGaZnO. InZnO, InSnZnO, ZnSnO, InWO, or ZnO may be used. Alternatively, the oxide semiconductor may be an oxide material including at least one element selected from the group of In, Ga, Zn, Sn, W, Al, Si, Ge, Ti, Ta, and Mg. Furthermore, the oxide semiconductor may be an oxynitride material obtained by adding nitrogen to the above-described oxide material, for example, an oxynitride material such as ZnON or InGaZnON.

Furthermore, the reset transistor 113 may be composed of a semiconductor other than an oxide semiconductor. In this case, the semiconductor layer of the reset transistor 113 may be composed mainly of a semiconductor having a larger band gap than the semiconductor composing the semiconductor substrate 121. The semiconductor layer of the reset transistor 113 may be composed mainly of a II-VI compound semiconductor, for example. At this point, the II-VI compound semiconductor is CdS, CdSe, CdTe, ZnTe, or the like. It should be noted that in this case also, as long as the transistor characteristics are not adversely affected, a small amount of impurity or minor components mixed during production may be included.

As described above, the photoelectric converter 111 is provided on the semiconductor substrate 121 via a multilayer interconnection structure. Furthermore, the semiconductor layer of the reset transistor 113 is provided in the upper interconnection layer, out of the lower interconnection layer and the upper interconnection layer included in the multilayer interconnection structure. At this point, the lower interconnection layer is lower side than the upper interconnection layer. That is, the lower interconnection layer is closer to the semiconductor substrate 121 than the upper interconnection layer is. The semiconductor layer of the reset transistor 113 is provided in the uppermost layer of the multilayer interconnection structure, for example. The reset transistor is disposed on the uppermost layer of the multilayer interconnection structure, whereby process damage can be further suppressed.

Furthermore, as described above, the pixel electrode 135 is composed of a light shielding material. At this point, when a light is irradiated to a transistor composed mainly of a semiconductor having a large band gap such as the oxide semiconductor layer, a characteristic shift of the transistor is easily generated. To prevent this, the active layer is covered by the pixel electrode as much as possible to shield a light, whereby the characteristic shift can be suppressed. In this manner, the characteristics of the reset transistor can be stabilized.

Embodiment 2

In the present embodiment, a variation of Embodiment 1 described above will be described. It should be noted that points different from Embodiment 1 will be mainly described below, and overlapping descriptions will be omitted.

Figure 4A:
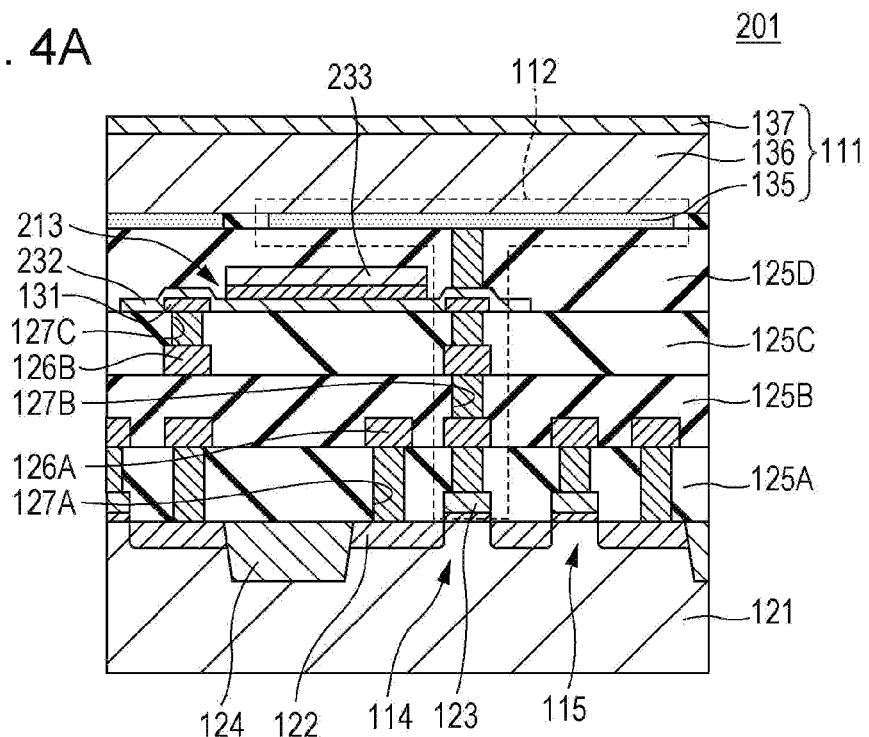
FIG. 4A is a cross-section view illustrating the structure of a pixel according to Embodiment 2.
Figure 4B:
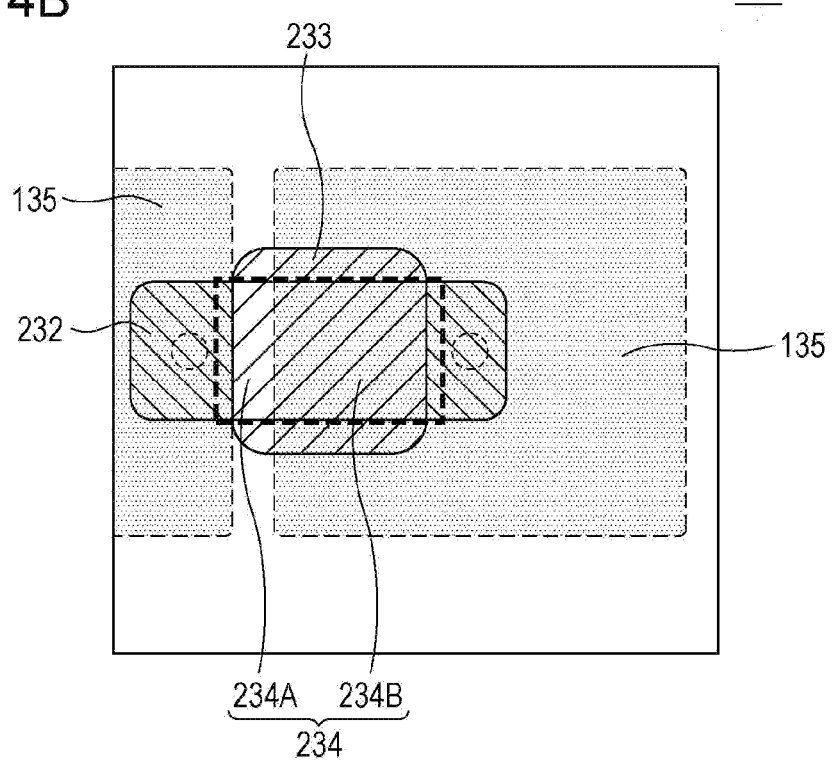
FIG. 4B is a plan view illustrating the structure of the pixel according to Embodiment 2.

FIG. 4A is a cross-section view illustrating the structure of a pixel 201 according to the present embodiment. FIG. 4B is a plan view of the pixel 201. It should be noted that in the plan view in FIG. 4B, for ease of understanding, an oxide semiconductor layer 232, a gate electrode 233, and a pixel electrode 135 are hatched in the same way as in FIG. 4A.

The pixel 201 illustrated in FIGS. 4A and 4B differs from the pixel 101 described in Embodiment 1 in that when compared with the central position between the pixel electrode 135 electrically connected to a reset transistor 213 and another pixel electrode 135 adjacent to the pixel electrode 135 in a plan view, at least part of the gate electrode 233 of the reset transistor 213 of the pixel 201 is disposed in a position closer to the adjacent pixel electrode 135.

More specifically, as illustrated in FIG. 4A, the gate electrode 233 of the reset transistor 213 is disposed in a manner enlarged toward the outside of the pixel electrode 135 to which the reset transistor 213 is electrically connected. The gate electrode 233 of the reset transistor 213 is also disposed in a manner enlarged into the pixel region of a pixel 201 adjacent to the pixel 201 in which the reset transistor 213 is disposed. A charge transport region 234 of the reset transistor 213 thus includes a region 234B overlapping the pixel electrode 135 and a region 234A not overlapping the pixel electrode 135 in a plan view, as illustrated in FIG. 4B.

At this point, the percentage of the region 234A not overlapping the pixel electrode 135 to the charge transport region 234 is higher than the percentage of the region 134A to the charge transport region 134 in Embodiment 1. More specifically, the area in which the pixel electrode 135 overlaps the charge transport region 234 is small. With this, a parasitic capacitance formed by the pixel electrode 135 of the photoelectric converter 111 and the charge transport region 234 of the reset transistor 213 can be reduced.

As described above, in the pixel 201, a parasitic capacitance formed by the pixel electrode 135 and the charge transport region 234 of the reset transistor 213 is reduced, whereby the dynamic range of the solid-state imaging device can be substantially widened.

Embodiment 3

In the present embodiment, a variation of Embodiment 1 described above will be described.

It should be noted that the circuit structure of a pixel 301 according to the present embodiment is the same as the circuit structure in Embodiment 1 illustrated in FIG. 2.

Figure 5A:
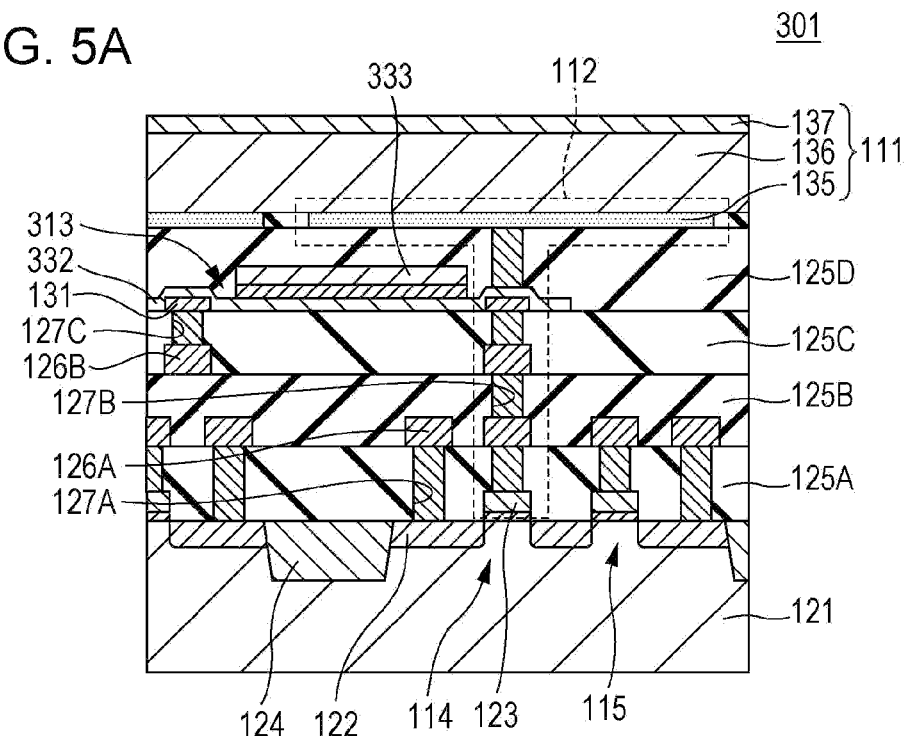
FIG. 5A is a cross-section view illustrating the structure of a pixel according to Embodiment 3.
Figure 5B:
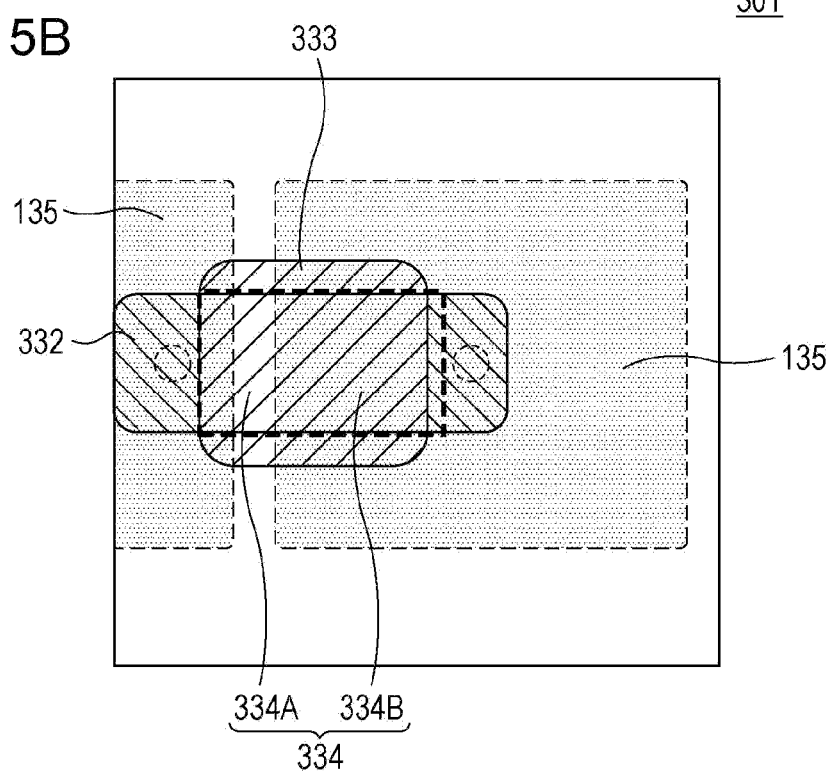
FIG. 5B is a plan view illustrating the structure of the pixel according to Embodiment 3.

FIG. 5A is a cross-section view illustrating the structure of the pixel 301 according to the present embodiment. FIG. 5B is a plan view of the pixel 301. It should be noted that in the plan view in FIG. 5B, for ease of understanding, an oxide semiconductor layer 332, a gate electrode 333, and a pixel electrode 135 are hatched in the same way as in FIG. 5A.

The pixel 301 illustrated in FIGS. 5A and 5B differs from the pixel 101 described in Embodiment 1 in that at least part of the gate electrode 333 of a reset transistor 313 of the pixel 301 overlaps the pixel electrode 135 adjacent to the pixel electrode 135 electrically connected to the reset transistor 313 in a plan view.

More specifically, as illustrated in FIG. 5A, the gate electrode 333 of the reset transistor 313 is disposed in a manner enlarged toward the outside of the pixel electrode 135 to which the reset transistor 313 is electrically connected. The gate electrode 333 of the reset transistor 313 is also disposed in a manner enlarged to a position where the gate electrode 333 of the reset transistor 313 is covered by the pixel electrode 135 of another pixel 301 adjacent to the pixel 301 in which the reset transistor 313 is disposed. A charge transport region 334 of the reset transistor 313 thus includes a region 334B overlapping the pixel electrode 135 and a region 334A not overlapping the pixel electrode 135 of the pixel 301 in a plan view, as illustrated in FIG. 5B.

At this point, the percentage of the region 334A not overlapping the pixel electrode 135 to the charge transport region 334 is higher than the percentage of the region 134A to the charge transport region 134 in Embodiment 1. More specifically, the area in which the pixel electrode 135 overlaps the charge transport region 334 is small. With this, a parasitic capacitance formed by the pixel electrode 135 of the photoelectric converter 111 and the charge transport region 334 of the reset transistor 313 can be reduced.

As described above, in the pixel 301, a parasitic capacitance formed by the pixel electrode 135 and the charge transport region 334 of the reset transistor 313 is reduced, whereby the dynamic range of the solid-state imaging device can be substantially widened.

Furthermore, as illustrated in FIGS. 5A and 5B, the distance between the drain electrode and the source electrode of the reset transistor 313, that is, the gate length of the reset transistor 313 may be made long, whereby off-leakage currents of the reset transistor 313 can be suppressed. In the solid-state imaging device, imaging thus can be performed in a high dynamic range.

Embodiment 4

In the present embodiment, a variation of Embodiment 1 described above will be described.

It should be noted that the circuit structure of a pixel 401 according to the present embodiment is the same as the circuit structure in Embodiment 1 illustrated in FIG. 2.

Figure 6A:
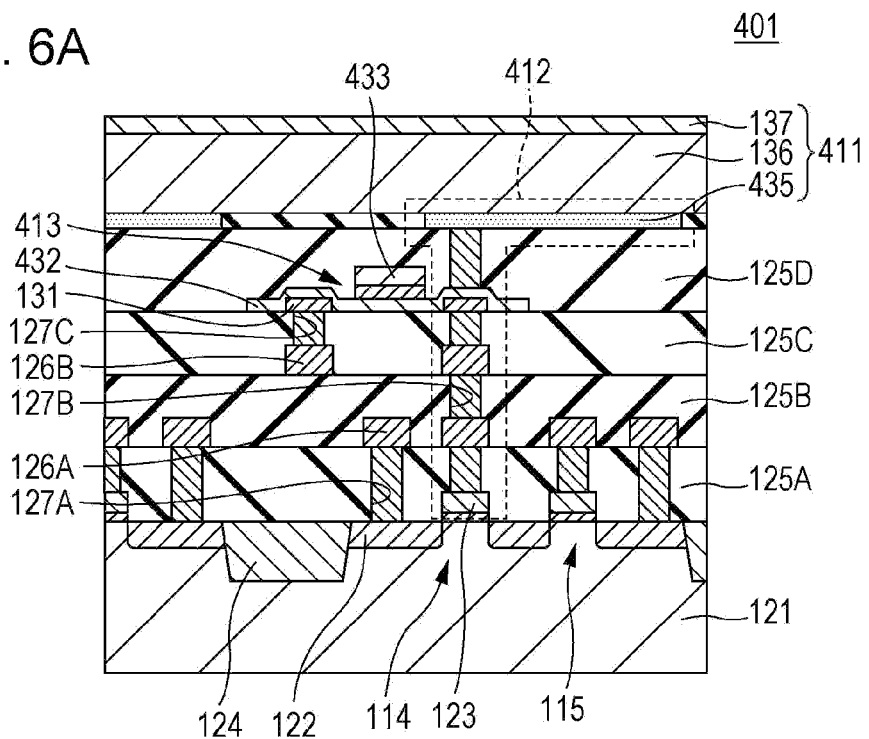
FIG. 6A is a cross-section view illustrating the structure of a pixel according to Embodiment 4.
Figure 6B:
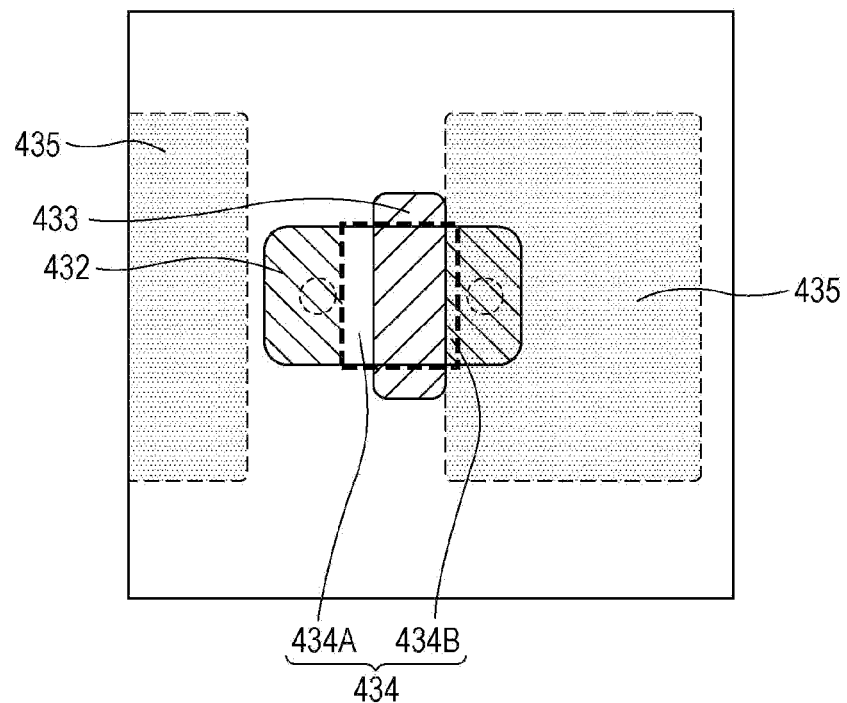
FIG. 6B is a plan view illustrating the structure of the pixel according to Embodiment 4.

FIG. 6A is a cross-section view illustrating the structure of the pixel 401 according to the present embodiment. FIG. 6B is a plan view of the pixel 401. It should be noted that in the plan view in FIG. 6B, for ease of understanding, an oxide semiconductor layer 432, a gate electrode 433, and a pixel electrode 435 are hatched in the same way as in FIG. 6A.

The pixel 401 illustrated in FIGS. 6A and 6B differs from the pixel 101 described in Embodiment 1 in that a charge transport region 434 of a reset transistor 413 of the pixel 401 is hardly covered by the pixel electrode 435 electrically connected to the reset transistor 413.

More specifically, as illustrated in FIG. 6A, the gate electrode 433 of the reset transistor 413 is disposed outside the pixel electrode 435 constructing a photoelectric converter 411. It is noted that the charge storage capacitance 412 is connected to the photoelectric converter 411 and accumulates electric charges generated by the photoelectric converter 411.

With this structure, the charge transport region 434 of the reset transistor 413 has a charge transport region 434B which overlaps the pixel electrode 435 and a charge transport region 434A which does not overlap the pixel electrode 435 in a plan view, as illustrated in FIG. 6B. And the charge transport region 434B has almost no area. With this, a parasitic capacitance formed by the pixel electrode 435 of the photoelectric converter 411 and the charge transport region 434 of the reset transistor 413 can be further reduced.

As described above, in the pixel 401, a parasitic capacitance formed by the pixel electrode 435 and the charge transport region 434 of the reset transistor 413 is reduced, whereby the dynamic range of the solid-state imaging device can be substantially widened.

Embodiment 5

In the present embodiment, a variation of Embodiment 4 described above will be described.

It should be noted that the circuit structure of a pixel 501 according to the present embodiment is the same as the circuit structure in Embodiment 1 illustrated in FIG. 2.

Figure 7A:
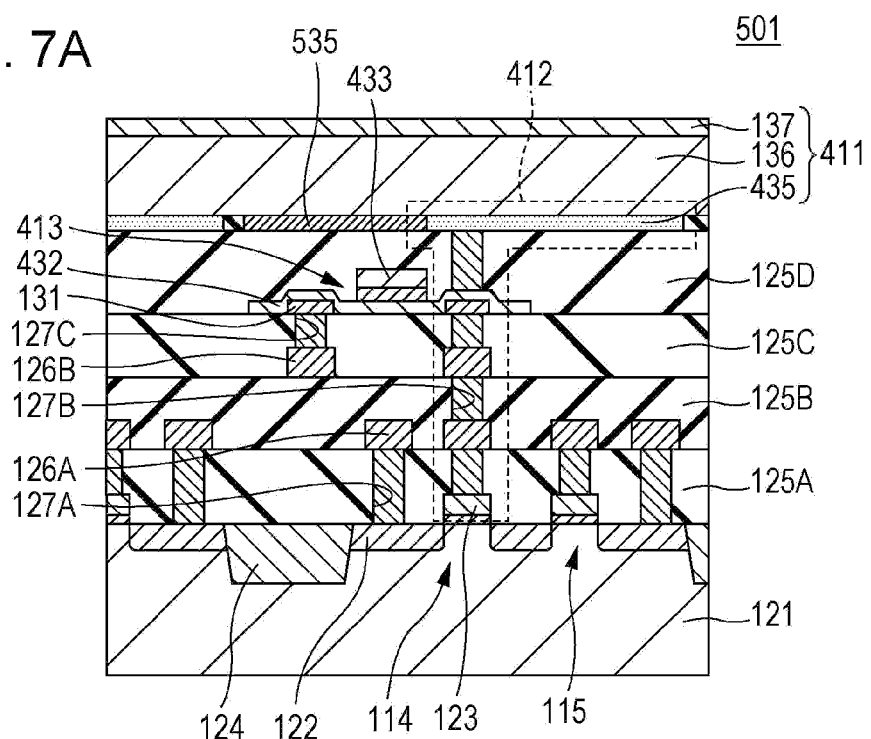
FIG. 7A is a cross-section view illustrating the structure of a pixel according to Embodiment 5.
Figure 7B:
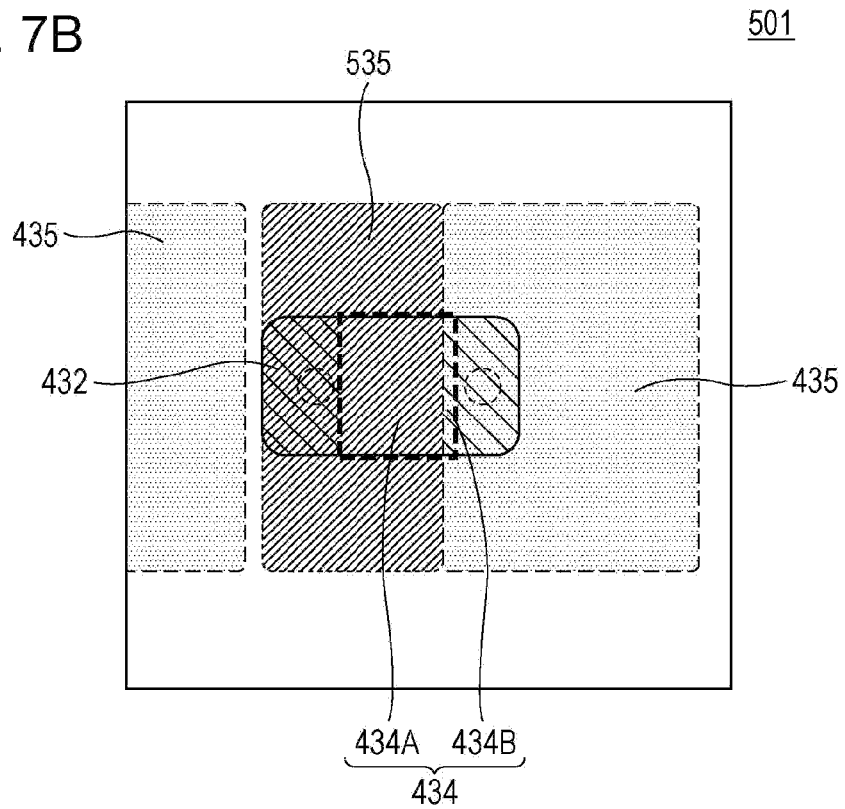
FIG. 7B is a plan view illustrating the structure of the pixel according to Embodiment 5.

FIG. 7A is a cross-section view illustrating the structure of the pixel 501 according to the present embodiment. FIG. 7B is a plan view of the pixel 501. It should be noted that in the plan view in FIG. 7B, for ease of understanding, the oxide semiconductor layer 432, the pixel electrode 435, and a light shielding film 535 are hatched in the same way as in FIG. 7A.

The pixel 501 illustrated in FIGS. 7A and 7B differs from the pixel 401 described in Embodiment 4 in that the light shielding film 535 having a light shielding property is provided in a position continuous with the pixel electrode 435 of the pixel 501.

As illustrated in FIG. 7A, the light shielding film 535 is formed above the gate electrode 433 of the reset transistor 413 and covers at least part of the gate electrode 433 in a plan view. The light shielding film 535 covers the entire charge transport region 434, for example.

That is, the charge transport region 434 of the reset transistor 413 has a charge transport region 434B which overlaps the pixel electrode 435 and a charge transport region 434A which does not overlap the pixel electrode 435 in a plan view, as illustrated in FIG. 7B. And the charge transport region 434A is covered by the light shielding film 535. With this, an incident light is shielded by the light shielding film 535, whereby an incident light on the charge transport region 434 of the reset transistor 413 is suppressed. This can suppress fluctuations of the threshold voltage of the reset transistor 413 due to the influence of an incident light. As a result, variations between the pixels and temporal changes in the operation can be suppressed, whereby the reliability can be improved.

It should be noted that the light shielding film 535 may be formed so as to cover the entire gate electrode 433 in a plan view. In other words, the light shielding film 535 may be formed so as to cover only part of the charge transport region 434. In this case also, the influence of an incident light on the reset transistor 413 can be reduced.

Furthermore, the light shielding film 535 may be formed so as to cover all of the charge transport region 434 and the two electrodes 131 being the source and the drain of the reset transistor 413 in a plan view. With this structure, the influence of an incident light on the reset transistor 413 can be reduced.

Embodiment 6

In the present embodiment, a variation of Embodiment 4 described above will be described. It should be noted that points different from Embodiment 4 will be mainly described below, and overlapping descriptions will be omitted.

Figure 8:
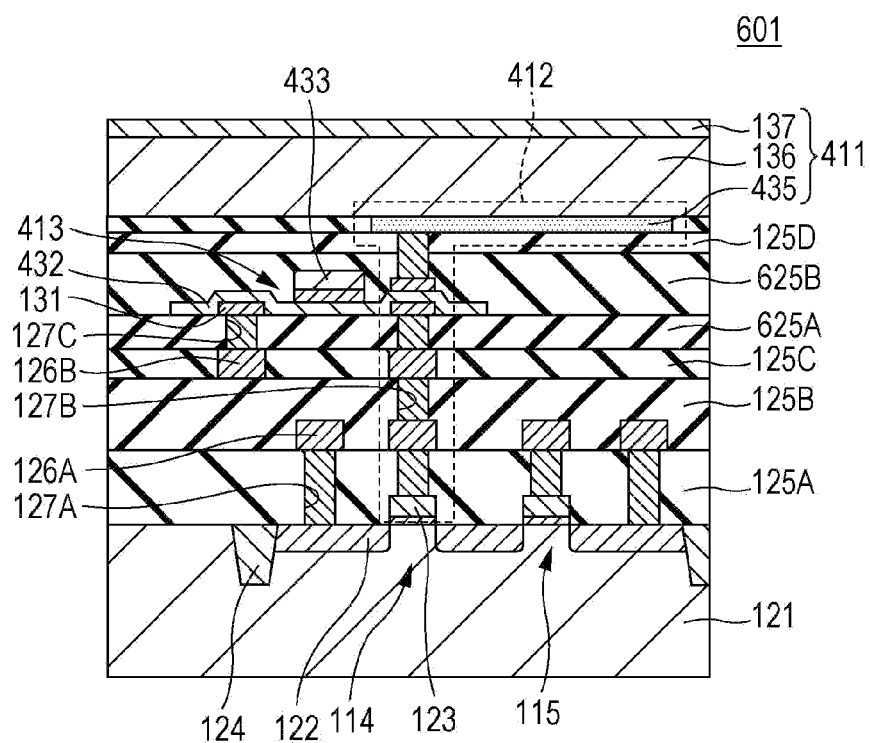
FIG. 8 is a cross-section view illustrating the structure of a pixel according to Embodiment 6.

FIG. 8 is a cross-section view illustrating the structure of a pixel 601 according to the present embodiment. The pixel 601 illustrated in FIG. 8 differs from the pixel 401 described in Embodiment 4 in that a silicon nitride films 625A and 625B are formed between the insulating layers 125C and 125D of the pixel 601. It should be noted that the insulating layers 125A to 125D are composed of a silicon oxide, for example.

More specifically, the insulating layer 125C in the pixel 401 illustrated in FIG. 6A corresponds to the insulating layer 125C and the silicon nitride film 625A disposed on the insulating layer 125C in the pixel 601 illustrated in FIG. 8. In the insulating layer 125C, the interconnection layer 126B is formed. In the silicon nitride film 625A, the contact 127C is formed.

Furthermore, the insulating layer 125D in the pixel 401 illustrated in FIG. 6A corresponds to the silicon nitride films 625B and the insulating layer 125D disposed on the silicon nitride film 625B in the pixel 601 illustrated in FIG. 8.

On the silicon nitride film 625A, a reset transistor 413 is formed. In the insulating layer 125D, a contact connected to the source electrode of the reset transistor 413 is formed. Furthermore, on the insulating layer 125D, a pixel electrode 435 constructing the photoelectric converter 111 is formed.

With this, the reset transistor 413 is constructed so as to be wrapped by the silicon nitride films 625A and 625B.

It should be noted that the reset transistor 413 includes an oxide semiconductor (InGaZnO) layer 432.

As described above, the silicon nitride films 625A and 625B are disposed between the insulating layers 125C and 125D, an impurity such as hydrogen is suppressed from diffusing into the oxide semiconductor (InGaZnO) layer 432 from the insulating layers 125B and 125C. Fluctuations of the threshold voltage of the reset transistor 413 thus can be suppressed. As a result, the reliability of the operations performed by the solid-state imaging device can be improved.

It should be noted that the material constructing the insulating layers 125A to 125D is not limited to a silicon oxide, and part of the layer may be composed of a silicon nitride.

Furthermore, although the structure in which the silicon nitride films 625A and 625B are provided has been described as a variation of Embodiment 4, the same structure may be applied to any structure in Embodiments 1 to 7.

Embodiment 7

In the present embodiment, a variation of Embodiment 1 described above will be described. It should be noted that points different from Embodiment 1 will be mainly described below, and overlapping descriptions will be omitted.

Figure 9A:
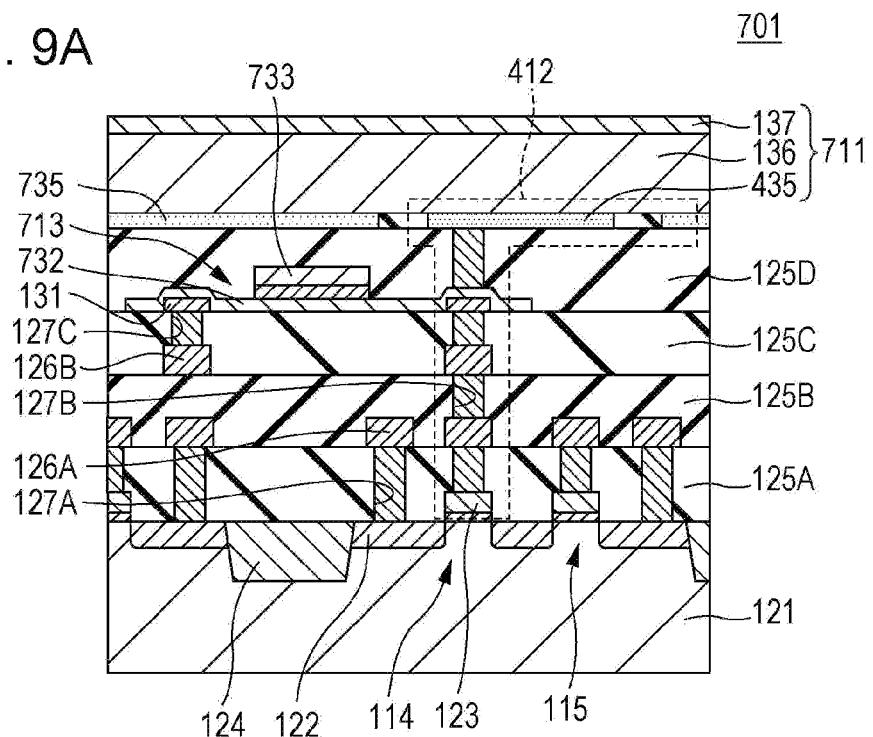
FIG. 9A is a cross-section view illustrating the structure of a pixel according to Embodiment 7.
Figure 9B:
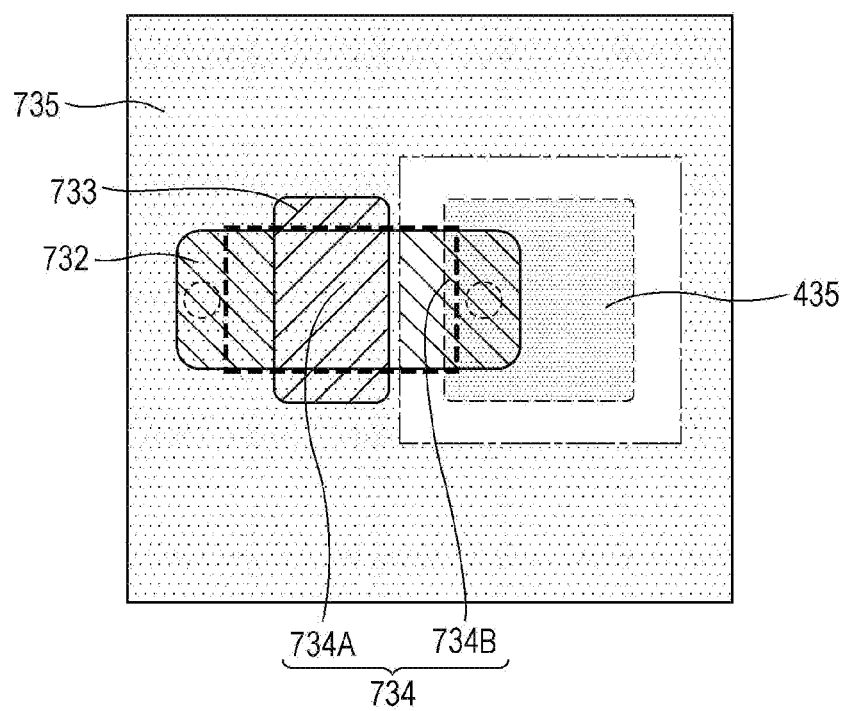
FIG. 9B is a plan view illustrating the structure of the pixel according to Embodiment 7.

FIG. 9A is a cross-section view illustrating the structure of a pixel 701 according to the present embodiment. FIG. 9B is a plan view of the pixel 701. It should be noted that in the plan view in FIG. 9B, for ease of understanding, an oxide semiconductor layer 732 and a dummy pixel electrode 735 are hatched in the same way as in FIG. 9A.

The pixel 701 according to the present embodiment differs from the pixel 101 described in Embodiment 1 in that the pixel 701 includes the dummy pixel electrode 735 composed of the same material and formed in the same layer as the pixel electrode 435 of a photoelectric converter 711 and an entire gate electrode 733 of a reset transistor 713 is covered by the dummy pixel electrode 735.

More specifically, as illustrated in FIGS. 9A and 9B, the entire gate electrode 733 of the reset transistor 713 of the pixel 701 is not covered by the pixel electrode 435. It should be noted that part of the gate electrode 733 of the reset transistor 713 of the pixel 701 may be covered by the pixel electrode 435.

Furthermore, as illustrated in FIG. 9A, the dummy pixel electrode 735 is composed of the same material and formed in the same layer as the pixel electrode. The dummy pixel electrode 735 is formed so as to surround the periphery of the pixel electrode 435 in a plan view, as illustrated in FIG. 9B. The entire gate electrode 733 of the reset transistor 713 is thus covered by the dummy pixel electrode 735.

A predetermined voltage is applied to the dummy pixel electrode 735. It should be noted that the dummy pixel electrode 735 is not limited to being applied with a predetermined voltage, and may be applied with no voltage or in a floating state, for example.

The charge transport region 734 of the reset transistor 713 has a charge transport region 734B which overlaps the pixel electrode 435 and a charge transport region 734A which does not overlap the pixel electrode 435 in a plan view, as illustrated in FIG. 9B. And part of the charge transport region 734A is covered by the dummy pixel electrode 735. With this, an incident light on the pixel 701 is shielded by the dummy pixel electrode 735, whereby an incident light on the charge transport region 734 of the reset transistor 713 is suppressed. This can suppress fluctuations of the threshold voltage of the reset transistor 713 due to the influence of an incident light. As a result, variations between the pixels and temporal changes in the operation can be suppressed, whereby the reliability of the imaging device can be improved.

It should be noted that the dummy pixel electrode 735 may be formed so as to cover only part of the gate electrode 733 in a plan view. In other words, the dummy pixel electrode 735 may be formed so as to cover only part of the charge transport region 734. In this case also, the influence of an incident light on the reset transistor 713 can be reduced.

The solid-state imaging device according to the present embodiment has been described above. However, the present disclosure is not limited to this embodiment.

The solid-state imaging device according to the embodiments described above is typically implemented as an LSI or SIC being an integrated circuit, for example. It should be noted that only part of a processor included in the solid-state imaging device may be integrated in one chip.

Furthermore, the cross-section views and plan views described above schematically illustrate the structures according to the embodiments described above. In the cross-section views and plan views described above, the corners and sides of each component are depicted in a straight line, but round corners and sides are included in the present disclosure, for example.

Furthermore, the circuit structure illustrated in the circuit diagram described above is merely an example and the present disclosure is not limited to the circuit structure described above. In other words, a circuit that can achieve the characteristic functions according to the present disclosure is also included in the present disclosure, similarly to the circuit structure described above.

For example, the pixel 101 illustrated in FIGS. 3A and 3B may further include a clamp transistor in addition to the structure of the pixel 101 illustrated in FIG. 2. In this case, the gate and the drain of the clamp transistor are connected to the charge storage capacitance, and a clamp voltage is applied to the source. Furthermore, the clamp transistor is composed of an oxide semiconductor, similarly to the reset transistor. Providing a clamp transistor as described above can suppress an excessive voltage from being applied to the amplification transistor, whereby breakage of the amplification transistor can be suppressed.

Furthermore, a circuit, in which elements such as a switching element (transistor), a resistance element, or a capacitance element are connected in series or parallel with respect to a certain element within the range that the same functions as in the circuit structure described above can be achieved, is also included in the present disclosure. In other words, "connected" in the embodiments described above is not limited to a case where two terminals (nodes) are directly connected but includes a case where the two terminals (nodes) are connected via an element within the range the same functions can be achieved.

All of the numerical values used in the description above are merely for exemplification for specifically explaining the present disclosure, and the present disclosure is not limited to the exemplified numerical values. Furthermore, the logic levels represented by high/low or the switching states represented by on/off is merely for exemplification for specifically explaining the present disclosure, and a different combination of the exemplified logic levels or the switching states may lead to equivalent outcomes. Furthermore, n type, p type, and other features for the transistors and other components are merely for exemplification for specifically explaining the present disclosure, and reversing these may leads to equivalent outcomes. Furthermore, the materials of each component described above are merely for exemplification for specifically explaining the present disclosure, and the present disclosure is not limited to the exemplified materials.

Furthermore, division in the functional blocks in the block diagram is merely an example. A plurality of functional blocks may be implemented as one functional block, one functional block may be divided into a plurality functional blocks, and part of the functions may be transferred to another functional block. Furthermore, functions of a plurality of functional blocks having similar functions may be processed in series or in time division by a single hardware device or a single software program.

A solid-state imaging device according to one or more aspects has been described above based on various embodiments. However, the present disclosure is not limited to these embodiments. Forms in which various variations conceived by the skilled person are adopted into an embodiment and forms established by combining various components in different embodiments may be included in the scope of the one or more aspects without departing from the purport of the present disclosure.

The present disclosure can be applied to a solid-state imaging device. Furthermore, the present disclosure can be applied to an imaging device such as a digital still camera and a digital video camera that includes a solid-state imaging device.

What is claimed is:

1. An imaging device comprising:
   a semiconductor substrate; and
   at least one unit pixel cell provided to a surface of the semiconductor substrate, each of the at least one unit pixel cell including:
   a photoelectric converter that includes a pixel electrode and a photoelectric conversion layer located on the pixel electrode, the photoelectric converter converting incident light into electric charges;
   a charge detection transistor that includes a part of the semiconductor substrate and detects the electric charges; and
   a reset transistor that includes a gate electrode and initializes a voltage of the photoelectric converter, wherein
   the pixel electrode, the reset transistor, and the charge detection transistor are arranged in that order toward the semiconductor substrate from the pixel electrode in cross sectional view, the reset transistor is included in one of the at least one unit pixel cell, and when viewed from the direction normal to the surface of the semiconductor substrate, at least a part of the gate electrode of the reset transistor is not covered by the pixel electrode of the photoelectric convertor included in the one of the at least one unit pixel cell,
   a first unit pixel cell and a second unit pixel cell are directly adjacent to each other, and
   when viewed from the direction normal to the surface of the semiconductor substrate, at least a part of the gate electrode included in the first unit pixel cell overlaps the pixel electrode included in the second unit pixel cell.

2. The imaging device according to claim 1, wherein
   the part of the semiconductor substrate comprises a first semiconductor,
   the reset transistor includes at least a part of a semiconductor layer, the at least a part of the semiconductor layer comprising a second semiconductor, and
   a band gap of the second semiconductor is larger than a band gap of the first semiconductor.

3. The imaging device according to claim 1, wherein
   the reset transistor includes a source electrode and a drain electrode, and
   the charge detection transistor is connected to the pixel electrode and one of the source electrode and the drain electrode.

4. The imaging device according to claim 1, wherein
   a first unit pixel cell and a second unit pixel cell are directly adjacent to each other, and
   when viewed from the direction normal to the surface of the semiconductor substrate, at least a part of the gate electrode included in the first unit pixel cell is closer to the pixel electrode included in the second unit pixel cell than the pixel electrode included in the first unit pixel cell.

5. The imaging device according to claim 1, wherein
   each of the at least one unit pixel cell further includes a light shielding film having a light shielding property, and
   when viewed from the direction normal to the surface of the semiconductor substrate, the light shielding film is located in a position continuous with the pixel electrode, at least a part of the gate electrode overlapping the light shielding film.

6. The imaging device according to claim 1, wherein
   the reset transistor includes at least a part of a semiconductor layer,
   the photoelectric converter is located above the surface of the semiconductor substrate through a multilayer interconnection structure, the multilayer interconnection structure including a first interconnection layer and a second interconnection layer, the first interconnection layer being closer to the semiconductor substrate than the second interconnection layer is, and
   the semiconductor layer is located above the first interconnection layer.

7. The imaging device according to claim 6, wherein the upper interconnection layer is an uppermost layer of the multilayer interconnection structure.

8. The imaging device according to claim 1, wherein the gate electrode of the reset transistor is closer to the pixel electrode than the semiconductor substrate.

9. The imaging device according to claim 1, wherein the gate electrode of the reset transistor directly faces the pixel electrode through an insulating layer.

* * * * *